(12) United States Patent
Liao et al.

(10) Patent No.: US 11,215,525 B2
(45) Date of Patent: Jan. 4, 2022

(54) WAFER-GRADE LED DETECTION DEVICE AND METHOD

(71) Applicant: ASTI GLOBAL INC., TAIWAN, Taichung (TW)

(72) Inventors: Chien-Shou Liao, New Taipei (TW); Te-Fu Chang, Taichung (TW); Chun-An Lu, Pingtung County (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 108 days.

(21) Appl. No.: 16/827,009

(22) Filed: Mar. 23, 2020

(65) Prior Publication Data

US 2021/0108987 A1 Apr. 15, 2021

(30) Foreign Application Priority Data

Oct. 9, 2019 (TW) ................................. 108136495

(51) Int. Cl.
| | | |
|---|---|---|
| *G01M 11/02* | (2006.01) | |
| *G01N 21/64* | (2006.01) | |
| *G01R 31/52* | (2020.01) | |

(52) U.S. Cl.
CPC ......... *G01M 11/0207* (2013.01); *G01N 21/64* (2013.01); *G01R 31/52* (2020.01)

(58) Field of Classification Search
None
See application file for complete search history.

(56) References Cited

U.S. PATENT DOCUMENTS

| 2013/0027543 | A1* | 1/2013 | Boeykens | G01R 31/2635 348/92 |
| 2013/0048873 | A1* | 2/2013 | Young | G01N 21/9501 250/459.1 |
| 2014/0141538 | A1* | 5/2014 | Hawryluk | H01L 33/005 438/7 |
| 2015/0077741 | A1* | 3/2015 | Faifer | G01R 31/2635 356/213 |

FOREIGN PATENT DOCUMENTS

| KR | 2011067843 A | * 6/2011 |
| KR | 2012067866 A | * 6/2012 |

* cited by examiner

*Primary Examiner* — Shawn Decenzo

(57) ABSTRACT

A wafer-grade LED detection device and a wafer-grade LED detection method are provided. The wafer-grade LED detection device includes a light-generating module for providing a first light beam that passes through an LED wafer to be converted into a second light beam, a light-filtering module adjacent to the LED wafer for receiving the second light beam that passes through the light-filtering module to be converted into a third light beam, and a light-detecting module adjacent to the light-filtering module for receiving and detecting the third light beam. A wavelength range of the second light beam is restricted by the light-filtering module, so that a wavelength range of the third light beam is smaller than the wavelength range of the second light beam. When the third light beam is received by the light-detecting module, the light-detecting module can detect the third light beam for obtaining relevant information.

10 Claims, 5 Drawing Sheets

WAFER-GRADE LED DETECTION DEVICE AND METHOD

CROSS-REFERENCE TO RELATED PATENT APPLICATION

This application claims the benefit of priority to Taiwan Patent Application No. 108136495, filed on Oct. 9, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an LED detection device and an LED detection method, and more particularly to a wafer-grade LED detection device and a wafer-grade LED detection method.

BACKGROUND OF THE DISCLOSURE

A light emitting diode (LED) is now widely used because of its excellent light quality and high luminous efficiency. Generally, in order to enhance color performance of a display device using LEDs as light emitters, a combination of red, green, and blue LED chips is used to form a full-color LED display device in the related art. The full-color LED display device can emit red, green and blue colors respectively through the red, green and blue LED chips, and then form a full-color light by mixing lights to display related information. However, the conventional LED detection device and the conventional LED detection method still need to be improved.

SUMMARY OF THE DISCLOSURE

In response to the above-referenced technical inadequacies, the present disclosure provides a wafer-grade LED detection device and a wafer-grade LED detection method.

In one aspect, the present disclosure provides a wafer-grade LED detection device, including: a light-generating module providing a first light beam that passes through an LED wafer to be converted into a second light beam, a light-filtering module receiving the second light beam that passes through the light-filtering module to be converted into a third light beam, and a light-detecting module receiving and detecting the third light beam. In addition, the light-generating module, the light-filtering module and the light-detecting module are disposed on an optical path, so that the first light beam, the second light beam and the third light beam are transmitted along the optical path. Furthermore, the second light beam has a wavelength range between a first minimum value and a first maximum value, the third light beam has a wavelength range between a second minimum value and a second maximum value, the second minimum value is larger than or equal to the first minimum value and is smaller than the second maximum value, and the second maximum value is smaller than or equal to the first maximum value and is larger than the second minimum value.

In another aspect, the present disclosure provides a wafer-grade LED detection device, including: a light-generating module providing a first light beam that passes through an LED wafer to be converted into a second light beam, a light-filtering module adjacent to the LED wafer for receiving the second light beam that passes through the light-filtering module to be converted into a third light beam, and a light-detecting module adjacent to the light-filtering module for receiving and detecting the third light beam. Furthermore, a wavelength range of the second light beam is restricted by the light-filtering module, so that a wavelength range of the third light beam is smaller than the wavelength range of the second light beam.

In yet another aspect, the present disclosure provides a wafer-grade LED detection method, including: providing a first light beam from a light-generating module, the first light beam passing through an LED wafer to be converted into a second light beam; receiving the second light beam by a light-filtering module, the second light beam passing through the light-filtering module to be converted into a third light beam; receiving the third light beam by a light-detecting module; and then detecting the third light beam by the light-detecting module. In addition, the light-generating module, the light-filtering module and the light-detecting module are disposed on an optical path, so that the first light beam, the second light beam and the third light beam are transmitted along the optical path. Furthermore, the second light beam has a wavelength range between a first minimum value and a first maximum value, the third light beam has a wavelength range between a second minimum value and a second maximum value, the second minimum value is larger than or equal to the first minimum value and is smaller than the second maximum value, and the second maximum value is smaller than or equal to the first maximum value and is larger than the second minimum value.

Therefore, by matching the features of "a light-generating module providing a first light beam that passes through an LED wafer to be converted into a second light beam (or providing a first light beam from a light-generating module, the first light beam passing through an LED wafer to be converted into a second light beam)" and "a light-filtering module receiving the second light beam that passes through the light-filtering module to be converted into a third light beam (or receiving the second light beam by a light-filtering module, the second light beam passing through the light-filtering module to be converted into a third light beam)", when the third light beam is received by the light-detecting module, the light-detecting module can detect the third light beam for obtaining relevant information such as a wavelength range, a brightness value, a leakage current value, etc.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
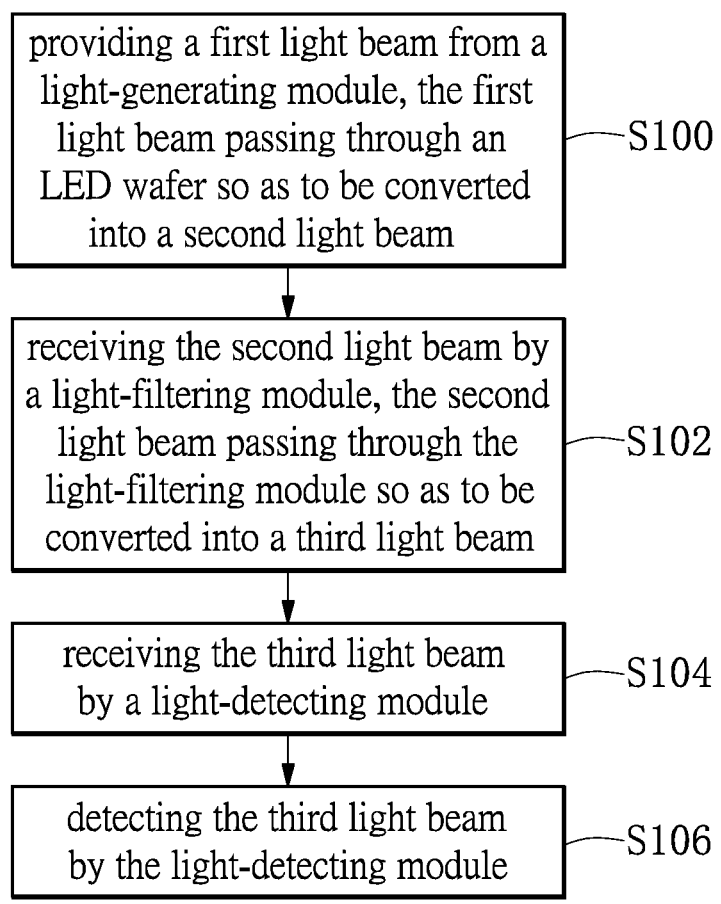
FIG. 1 is a flowchart of a wafer-grade LED detection method according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 5, the present disclosure provides a wafer-grade LED detection device Z (or an LED wafer detection device), including a light-generating module 1, a light-filtering module 2 and a light-detecting module 3. Firstly, the light-generating module 1 is capable of providing a first light beam L1, and the first light beam L1 can pass through an LED wafer W so as to be converted (changed or formed) into a second light beam L2. In addition, the light-filtering module 2 is adjacent to the LED wafer W for receiving the second light beam L2, and the second light beam L2 can pass through the light-filtering module 2 so as to be converted into a third light beam L3. Moreover, the light-detecting module 3 is adjacent to the light-filtering module 2 for receiving the third light beam L3 and is capable of detecting the third light beam L3. More particularly, the light-generating module 1, the light-filtering module 2 and the light-detecting module 3 can be disposed on an optical path P, so that the first light beam L1, the second light beam L2 and the third light beam L3 can be transmitted along the optical path P.

It should be noted that a wavelength range of the second light beam L2 is restricted (limited or fixed) by the light-filtering module 2, so that a wavelength range of the third light beam L3 is smaller than the wavelength range of the second light beam L2. For example, if the second light beam L2 has a wavelength range between a first minimum value (such as 400 nm) and a first maximum value (such as 600 nm), when the wavelength range of the second light beam L2 is restricted by the light-filtering module 2, a wavelength range of the third light beam L3 (such as blue light) is restricted between a second minimum value (such as 450 nm) and a second maximum value (such as 480 nm), so that the second minimum value is larger than or equal to the first minimum value and is smaller than the second maximum value, and the second maximum value is smaller than or equal to the first maximum value and is larger than the second minimum value. However, the aforementioned description for the second light beam L2 and the third light beam L3 is merely an example and is not meant to limit the present disclosure.

It should be noted that the present disclosure further provides a wafer-grade LED detection method, including: firstly, providing a first light beam L1 from a light-generating module 1, the first light beam L1 passing through an LED wafer W so as to be converted into a second light beam L2 (step S100); next, receiving the second light beam L2 by a light-filtering module 2, the second light beam L2 passing through the light-filtering module 2 so as to be converted into a third light beam L3 (step S102); afterwards, receiving the third light beam L3 by a light-detecting module 3 (step S104); and then, detecting the third light beam L3 by the light-detecting module 3 (step S106). For example, the light-detecting module 3 may be a photoluminescence spectrometer or any kind of optical detector. In addition, the third light beam L3 can be detected by the light-detecting module 3 to obtain information that at least includes a wavelength range, a brightness value, a leakage current value, etc., so that a wavelength range, a brightness value and a leakage current value of each wafer-grade LED of the LED wafer W can be obtained indirectly and respectively according to the wavelength range, the brightness value and the leakage current value of the information that has been obtained by detecting the third light beam L3. However, the aforementioned description for the information of the third light beam L3 is merely an example and is not meant to limit the present disclosure.

It is worth mentioning that photoluminescence, often referred to as PL, is when light energy or photons stimulate the emission of a photon from any matter. It is a non-contact, nondestructive method of probing materials. In essence, light is directed onto a sample, where it is absorbed and where a process called photo-excitation can occur. The photo-excitation causes the material to jump to a higher electronic state, and will then release energy, (photons) as it relaxes and returns to back to a lower energy level. The emission of light or luminescence through this process is photoluminescence. Photoluminescence spectroscopy is a contactless, nondestructive method of probing the electronic structure of materials. Light is directed onto a sample, where it is absorbed and imparts excess energy into the material in a process called photo-excitation. One way this excess energy can be dissipated by the sample is through the emission of light, or luminescence. In the case of photo-excitation, this luminescence is called photoluminescence. Photo-excitation causes electrons within a material to move into permissible excited states. When these electrons return to their equilibrium states, the excess energy is released and may include the emission of light (a radiative process) or may not (a non-radiative process). The energy of the emitted light (photoluminescence) relates to the difference in energy levels between the two electron states involved in the transition between the excited state and the equilibrium state. The quantity of the emitted light is related to the relative contribution of the radiative process. Therefore, the LED wafer W includes a plurality of wafer-grade LED chips can be detected optically by the photoluminescence spectroscopy. That is to say, when the first light beam L1 is projected onto at least one of the wafer-grade LED chips of the LED wafer W, the first light beam L1 can be converted into the second light beam L2 by the at least one wafer-grade LED chip without being supplied with power, so that the at least one wafer-grade LED chip without being supplied with power can be triggered by the first light beam L1 so as to generate the second light beam L2.

First Embodiment

Figure 2:
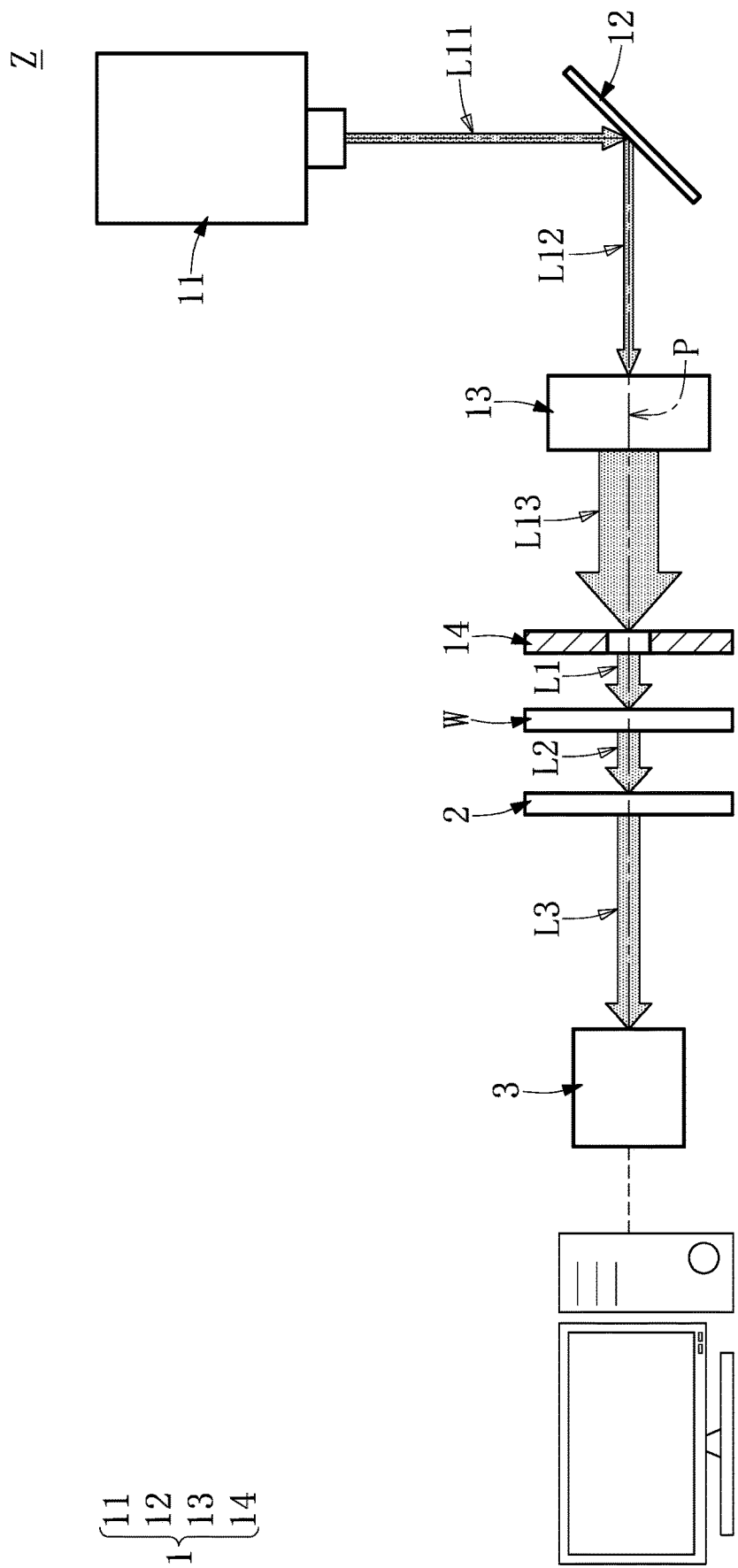
FIG. 2 is a schematic view of a wafer-grade LED detection device according to a first embodiment of the present disclosure.

Referring to FIG. 2, the first embodiment of the present disclosure provides a wafer-grade LED detection device Z (or an LED wafer detection device), including a light-generating module 1, a light-filtering module 2 and a light-detecting module 3, and the light-detecting module 3 may be electrically connected to a computer.

More particularly, the light-generating module 1 includes a light generator 11, a light-reflecting mirror 12, a light shape regulator 13 and a light area regulator 14. Firstly, the light generator L11 is capable of generating an initial light beam L11, and the initial light beam L11 can be reflected by the light-reflecting mirror 12 so as to be converted into a reflected light beam L12 that is projected onto the light shape regulator 13. In addition, the reflected light beam L12 can pass through the light shape regulator 13 so as to be converted into a shaping light beam L13 for changing light shape or light pattern (for example, the light shape can be changed from a point pattern into a square pattern or a circle pattern by the light shape regulator 13), and the shaping light beam L13 can pass through the light area regulator 14 so as to be converted into the first light beam L1 for changing light area or light region (for example, the shaping light beam L13 of large area can be changed into the first light beam L1 of small area by the light area regulator 14). It should be noted that the light generator 11, the light-reflecting mirror 12, the light shape regulator 13 and the light area regulator 14 are disposed on the optical path P, so that the initial light beam L11, the reflected light beam L12 and the shaping light beam L13 can be transmitted along the optical path P.

For example, the shape (such as point pattern) of the light-reflecting light beam L12 that has been projected onto the light shape regulator 13 is different from the shape (such as squire or circle pattern) of the shaping light beam L13 that has been projected onto the light area regulator 14, and the area of the shape of the shaping light beam L13 that has been projected onto the light area regulator 14 is larger than the area of the shape of the reflected light beam L12 that has been projected onto the light shape regulator 13. In addition, the shape of the shaping light beam L13 that has been projected onto the light area regulator 14 is substantially the same as or similar to the shape of the first light beam L1 that has been projected onto the LED wafer W, and the area of the shape of the first light beam L1 that has been projected onto the LED wafer W is smaller than the area of the shape of the shaping light beam L13 that has been projected onto the light area regulator 14. It should be noted that the initial light beam L11 and the reflected light beam L12 are perpendicular to each other, and the reflected light beam L12, the shaping light beam L13, the first light beam L1, the second light beam L2 and the third light beam L3 are parallel to each other. However, the aforementioned example is merely an example and is not meant to limit the present disclosure.

For example, the light-filtering module 2 may be a filter or a color filter, but it is merely an example and is not meant to limit the present disclosure. In addition, the light-detecting module 3 at least includes an optical lens for capturing the third light beam L3 and an optical detector for detecting the third light beam L3, but it is merely an example and is not meant to limit the present disclosure.

Second Embodiment

Figure 3:
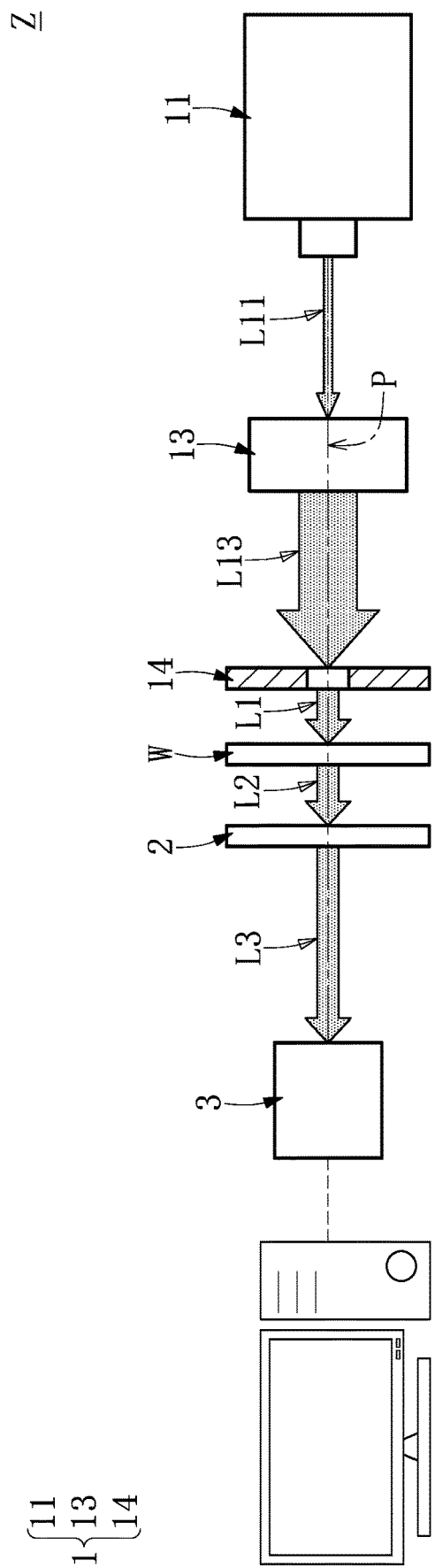
FIG. 3 is a schematic view of the wafer-grade LED detection device according to a second embodiment of the present disclosure.

Referring to FIG. 3, the second embodiment of the present disclosure provides a wafer-grade LED detection device Z (or an LED wafer detection device), includes a light-generating module 1, a light-filtering module 2 and a light-detecting module 3, and the light-detecting module 3 may be electrically connected to a computer.

More particularly, the light-generating module 1 includes a light generator 11, a light shape regulator 13 and a light area regulator 14. Firstly, the light generator L11 is capable of generating an initial light beam L11, and the initial light beam L11 can pass through the light shape regulator 13 so as to be converted into a shaping light beam L13 for changing light shape or light pattern (for example, the light shape can be changed from a point pattern into a square pattern or a circle pattern by the light shape regulator 13), and the shaping light beam L13 can pass through the light area regulator 14 so as to be converted into the first light beam L1 for changing light area or light region (for example, the shaping light beam L13 of large area can be changed into the first light beam L1 of small area by the light area regulator 14). It should be noted that the light generator 11, the light shape regulator 13 and the light area regulator 14 are disposed on the optical path P, so that the initial light beam L11 and the shaping light beam L13 can be transmitted along the optical path P.

For example, the shape (such as point pattern) of the initial light beam L11 that has been projected onto the light shape regulator 13 is different from the shape (such as squire or circle pattern) of the shaping light beam L13 that has been projected onto the light area regulator 4, and the area of the shape of the shaping light beam L13 that has been projected onto the light area regulator 14 is larger than the area of the shape of the initial light beam L11 that has been projected onto the light shape regulator 13. In addition, the shape of the shaping light beam L13 that has been projected onto the light area regulator 14 is substantially the same as or similar to the shape of the first light beam L11 that has been projected onto the LED wafer W, and the area of the shape of the first light beam 1 that has been projected onto the LED wafer W is smaller than the area of the shape of the shaping light beam L13 that has been projected onto the light area regulator 14. It should be noted that the shaping light beam L13, the first light beam L1, the second light beam L2 and the third light beam L3 are parallel to each other. However, the aforementioned example is merely an example and is not meant to limit the present disclosure.

For example, the light-filtering module 2 may be a filter or a color filter, but it is merely an example and is not meant to limit the present disclosure. In addition, the light-detecting module 3 at least includes an optical lens for capturing the third light beam L3 and an optical detector for detecting the third light beam L3, but it is merely an example and is not meant to limit the present disclosure.

Third Embodiment

Figure 4:
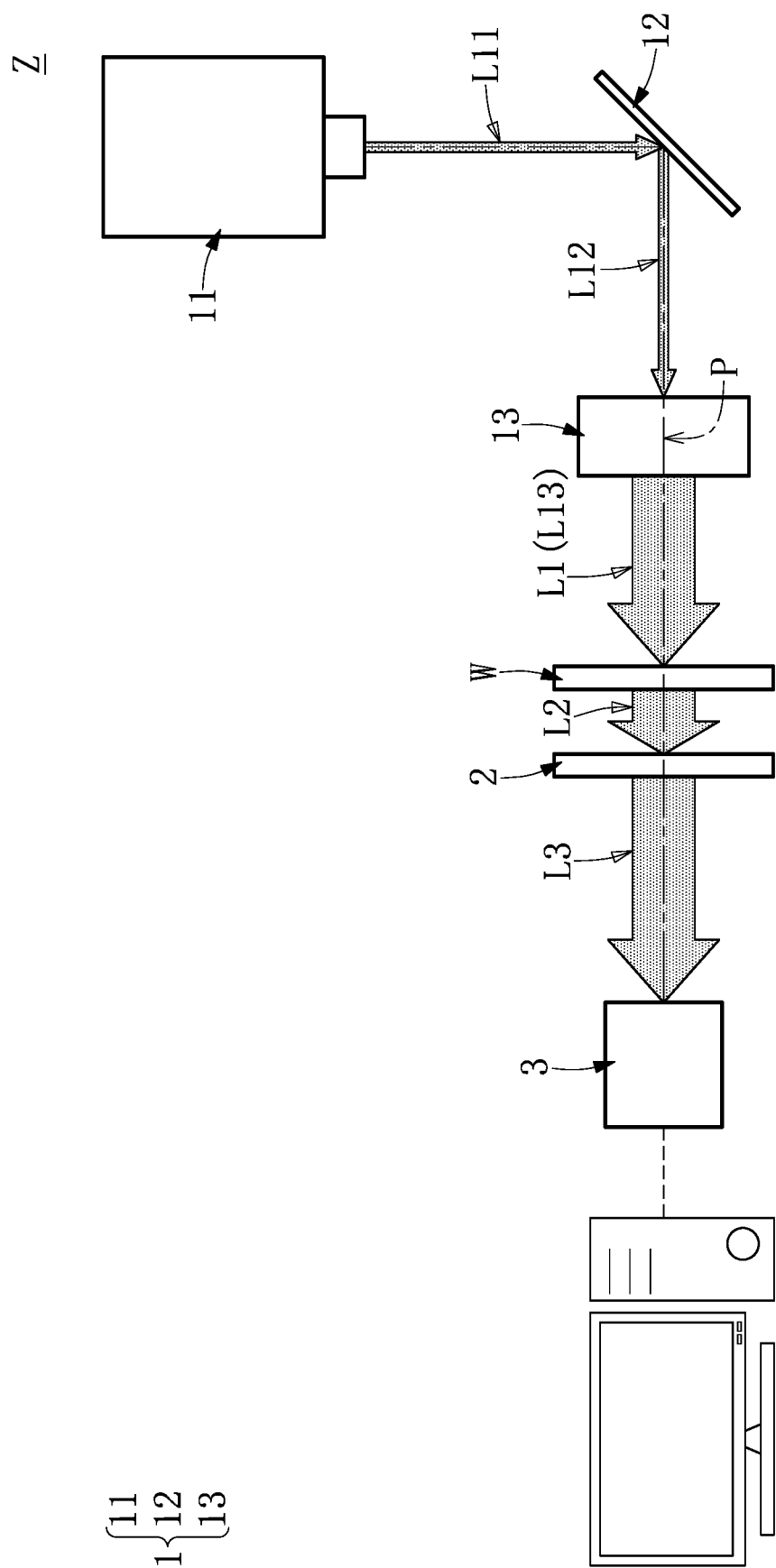
FIG. 4 is a schematic view of the wafer-grade LED detection device according to a third embodiment of the present disclosure.

Referring to FIG. 4, the third embodiment of the present disclosure provides a wafer-grade LED detection device Z (or an LED wafer detection device), includes a light-generating module 1, a light-filtering module 2 and a light-detecting module 3. As compared with FIG. 4 and FIG. 2, the difference between the third embodiment and the first embodiment is as follows: the wafer-grade LED detection device Z of the third embodiment can omit the light area regulator 14 that is applied to the first embodiment, but the light shape regulator 13 is still applied to the third embodiment. Therefore, when the shaping light beam L13 (i.e., the first light beam L1) of large area is directly projected on the LED wafer W, the shapes of the first light beam L1, the second light beam L2 and the third light beam L3 shall be substantially the same, so that the detection area provided by the third light beam L3 that is projected onto the LED wafer W is increased.

Fourth Embodiment

Figure 5:
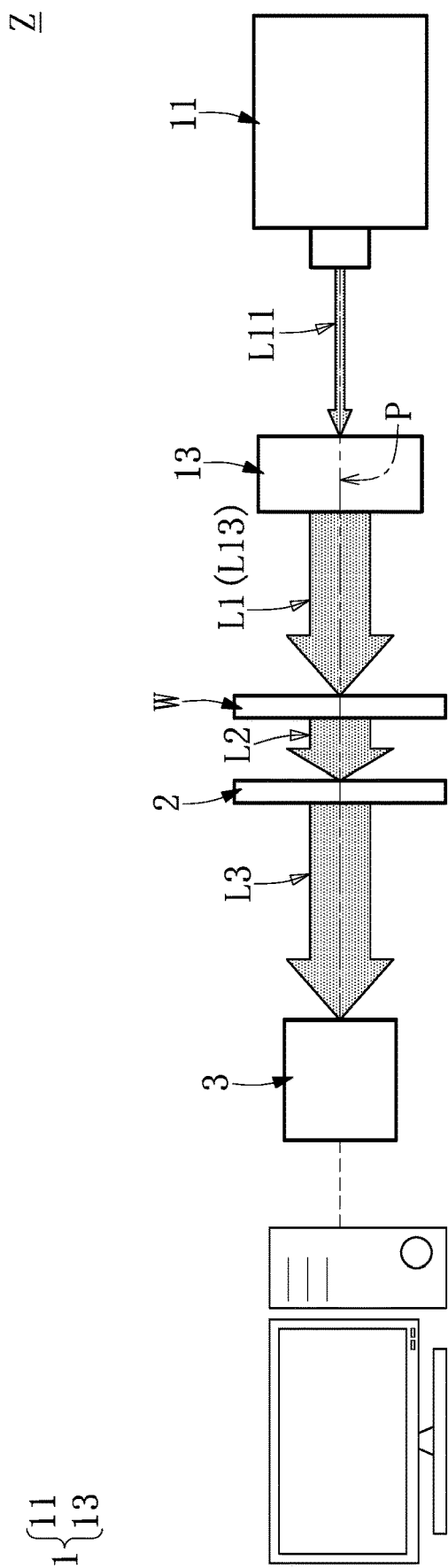
FIG. 5 is a schematic view of the wafer-grade LED detection device according to a fourth embodiment of the present disclosure.

Referring to FIG. 5, the fourth embodiment of the present disclosure provides a wafer-grade LED detection device Z (or an LED wafer detection device), includes a light-generating module 1, a light-filtering module 2 and a light-detecting module 3. As compared with FIG. 5 and FIG. 3, the difference between the fourth embodiment and the second embodiment is as follows: the wafer-grade LED detection device Z of the fourth embodiment can omit the light area regulator 14 that is applied to the second embodiment, but the light shape regulator 13 is still applied to the fourth embodiment. Therefore, when the shaping light beam L13 (i.e., the first light beam L1) of large area is directly projected on the LED wafer W, the shapes of the first light beam L1, the second light beam L2 and the third light beam L3 shall be substantially the same, so that the detection area provided by the third light beam L3 that is projected onto the LED wafer W is increased.

In conclusion, by matching the features of "a light-generating module 1 providing a first light beam L1 that passes through an LED wafer W to be converted into a second light beam L2 (or providing a first light beam L1 from a light-generating module 1, the first light beam L1 passing through an LED wafer W to be converted into a second light beam L2)" and "a light-filtering module 2 receiving the second light beam L2 that passes through the light-filtering module 2 to be converted into a third light beam L3 (or receiving the second light beam L2 by a light-filtering module 2, the second light beam L2 passing through the light-filtering module 2 to be converted into a third light beam L3)", when the third light beam L3 is received by the light-detecting module 3, the light-detecting module 3 can detect the third light beam L3 for obtaining relevant information such as a wavelength range, a brightness value, a leakage current value, etc.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wafer-grade LED detection device, comprising:
a light-generating module providing a first light beam that passes through an LED wafer to be converted into a second light beam, the light-generating module comprising:
a light generator generating an initial light beam;
a light shape regulator, wherein the initial light passes through the light shape regulator to be converted into a shaping light beam for changing light shape; and
a light area regulator, wherein the shaping light beam passes through the light area regulator and is converted into the first light beam, the area of the shaping light beam that has been projected onto the light area regulator is larger than the area of the initial light beam that has been projected onto the light shape regulator, the shape of the shaping light beam that has been projected onto the light area regulator is the same as the shape of the first light beam that has been projected onto the LED wafer, and the area of the first light beam that has been projected onto the LED wafer is smaller than the area of the shaping light beam that has been projected onto the light area regulator;
a light-filtering module receiving the second light beam that passes through the light-filtering module to be converted into a third light beam; and
a light-detecting module receiving and detecting the third light beam;
wherein the light-generating module, the light-filtering module and the light-detecting module are disposed on an optical path, so that the first light beam, the second light beam and the third light beam are transmitted along the optical path;
wherein the second light beam has a wavelength range between a first minimum value and a first maximum value, the third light beam has a wavelength range between a second minimum value and a second maximum value, the second minimum value is larger than or equal to the first minimum value and is smaller than the second maximum value, and the second maximum value is smaller than or equal to the first maximum value and is larger than the second minimum value.

2. The wafer-grade LED detection device according to claim 1, wherein the light-generating module further comprises a light-reflecting mirror, the initial light beam is reflected by the light-reflecting mirror to be converted into a reflected light beam that is projected onto the light shape regulator, and the reflected light beam passes through the light shape regulator to be converted into the shaping light beam for changing light shape; wherein the initial light beam and the reflected light beam are perpendicular to each other, and the reflected light beam, the shaping light beam, the first light beam, the second light beam and the third light beam are parallel to each other.

3. The wafer-grade LED detection device according to claim 1, wherein the initial light beam, the shaping light beam, the first light beam, the second light beam and the third light beam are parallel to each other.

4. A wafer-grade LED detection device, comprising:
a light-generating module providing a first light beam that passes through an LED wafer to be converted into a second light beam, the light-generating module comprising:
  a light generator generating an initial light beam;
  a light shape regulator, wherein the initial light passes through the light shape regulator to be converted into a shaping light beam for changing light shape; and
  a light area regulator, wherein the shaping light beam passes through the light area regulator and is converted into the first light beam, the area of the shaping light beam that has been projected onto the light area regulator is larger than the area of the initial light beam that has been projected onto the light shape regulator, the shape of the shaping light beam that has been projected onto the light area regulator is the same as the shape of the first light beam that has been projected onto the LED wafer, and the area of the first light beam that has been projected onto the LED wafer is smaller than the area of the shaping light beam that has been projected onto the light area regulator;
a light-filtering module adjacent to the LED wafer for receiving the second light beam that passes through the light-filtering module to be converted into a third light beam; and
a light-detecting module adjacent to the light-filtering module for receiving and detecting the third light beam;
wherein a wavelength range of the second light beam is restricted by the light-filtering module, so that a wavelength range of the third light beam is smaller than the wavelength range of the second light beam.

5. The wafer-grade LED detection device according to claim 4, wherein the light-generating module further comprises a light-reflecting mirror, the initial light beam is reflected by the light-reflecting mirror to be converted into a reflected light beam that is projected onto the light shape regulator, and the reflected light beam passes through the light shape regulator to be converted into the shaping light beam for changing light shape; wherein the initial light beam and the reflected light beam are perpendicular to each other, and the reflected light beam, the shaping light beam, the first light beam, the second light beam and the third light beam are parallel to each other.

6. The wafer-grade LED detection device according to claim 4, wherein the initial light beam, the shaping light beam, the first light beam, the second light beam and the third light beam are parallel to each other.

7. A wafer-grade LED detection method, comprising:
providing a first light beam from a light-generating module, the first light beam passing through an LED wafer to be converted into a second light beam;
receiving the second light beam by a light-filtering module, the second light beam passing through the light-filtering module to be converted into a third light beam;
receiving the third light beam by a light-detecting module; and
detecting the third light beam by the light-detecting module;
wherein the light-generating module comprises a light generator, a light shape regulator and a light area regulator, an initial light beam is generated by the light generator and passes through the light shape regulator to be converted into a shaping light beam for changing light shape, the shaping light beam passes through the light area regulator to be converted into the first light beam for changing light area, the area of the shaping light beam that has been projected onto the light area regulator is larger than the area of the initial light beam that has been projected onto the light shape regulator, the shape of the shaping light beam that has been projected onto the light area regulator is the same as the shape of the first light beam that has been projected onto the LED wafer, and the area of the first light beam that has been projected onto the LED wafer is smaller than the area of the shaping light beam that has been projected onto the light area regulator;
wherein the light-generating module, the light-filtering module and the light-detecting module are disposed on an optical path, so that the first light beam, the second light beam and the third light beam are transmitted along the optical path;
wherein the second light beam has a wavelength range between a first minimum value and a first maximum value, the third light beam has a wavelength range between a second minimum value and a second maximum value, the second minimum value is larger than or equal to the first minimum value and is smaller than the second maximum value, and the second maximum value is smaller than or equal to the first maximum value and is larger than the second minimum value.

8. The wafer-grade LED detection method according to claim 7, wherein the light-generating module further comprises a light-reflecting mirror, the initial light beam is reflected by the light-reflecting mirror to be converted into a reflected light beam that is projected onto the light shape regulator, and the reflected light beam passes through the light shape regulator to be converted into the shaping light beam for changing light shape; wherein the initial light beam and the reflected light beam are perpendicular to each other, and the reflected light beam, the shaping light beam, the first light beam, the second light beam and the third light beam are parallel to each other.

9. The wafer-grade LED detection method according to claim 7, wherein the initial light beam, the shaping light beam, the first light beam, the second light beam and the third light beam are parallel to each other.

10. The wafer-grade LED detection method according to claim 7, wherein the third light beam is detected by the light-detecting module to obtain information including a wavelength range, a brightness value and a leakage current value.

* * * * *